United States Patent
Weaver et al.

(10) Patent No.: US 7,879,203 B2
(45) Date of Patent: Feb. 1, 2011

(54) METHOD AND APPARATUS FOR CATHODIC ARC ION PLASMA DEPOSITION

(75) Inventors: Scott Andrew Weaver, Ballston Lake, NY (US); William Thomas Carter, Galway, NY (US); Paul Mario Marruso, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 628 days.

(21) Appl. No.: 11/609,078

(22) Filed: Dec. 11, 2006

(65) Prior Publication Data

US 2008/0138529 A1    Jun. 12, 2008

(51) Int. Cl.
C23C 14/00 (2006.01)
C23C 16/00 (2006.01)
C25D 17/00 (2006.01)
H05H 1/24 (2006.01)
H05H 1/32 (2006.01)
H01T 14/00 (2006.01)

(52) U.S. Cl. .................. 204/192.38; 204/298.21; 204/298.22; 204/422; 204/298.01; 427/569; 427/540; 427/580; 118/715

(58) Field of Classification Search ........... 204/192.38, 204/298.21, 422, 298.01; 427/569, 540, 427/580
See application file for complete search history.

(56) References Cited

U.S. PATENT DOCUMENTS

| | | | | |
|---|---|---|---|---|
| 4,407,713 A | * | 10/1983 | Zega | 204/298.22 |
| 4,673,477 A | * | 6/1987 | Ramalingam et al. | 204/192.38 |
| 4,839,011 A | * | 6/1989 | Ramalingam et al. | 204/192.38 |
| 4,849,088 A | * | 7/1989 | Veltrop et al. | 204/298.41 |
| 5,026,466 A | * | 6/1991 | Wesemeyer et al. | 204/192.38 |
| 5,037,522 A | | 8/1991 | Vergason | |
| 5,096,562 A | * | 3/1992 | Boozenny et al. | 204/298.22 |
| 5,518,597 A | | 5/1996 | Storer et al. | |
| 5,932,078 A | | 8/1999 | Beers et al. | |
| 6,036,828 A | | 3/2000 | Beers et al. | |
| 6,224,726 B1 | | 5/2001 | Beers et al. | |
| 6,261,424 B1 | * | 7/2001 | Goncharenko et al. | 204/192.38 |
| 6,409,898 B1 | | 6/2002 | Weaver et al. | |
| 6,436,252 B1 | * | 8/2002 | Tzatzov et al. | 204/298.22 |
| 6,436,254 B1 | | 8/2002 | Weaver et al. | |
| 6,608,432 B2 | | 8/2003 | Weaver et al. | |
| 6,821,399 B2 | | 11/2004 | Weaver et al. | |
| 6,964,818 B1 | * | 11/2005 | Darolia | 428/632 |

(Continued)

OTHER PUBLICATIONS

S. A. Mouboiadjian et al., "Equipment technology and protective coatings produced by ion bombardment deposition," Elsevier, Surface and Coatings Technology 91, 1997, pp. 13-19.

*Primary Examiner*—Timothy H Meeks
*Assistant Examiner*—Mandy C Louie
(74) *Attorney, Agent, or Firm*—Penny A. Clarke

(57) ABSTRACT

A method and apparatus for depositing a coating material on a surface of a substrate by an ion plasma deposition process using a hollow cathode is disclosed. The cathode may be a substantially cylindrical hollow cathode. A plasma arc is formed on the outer circumference of the cathode to remove coating material from the cathode, which is then deposited on a surface of a substrate. An internal arc drive magnet is contained within the hollow bore of the cathode and cooling is provided to the magnet during operation.

8 Claims, 4 Drawing Sheets

U.S. PATENT DOCUMENTS

2004/0084297 A1* 5/2004 Anazawa et al. ............ 204/173
2004/0185182 A1  9/2004 Lipkin et al.
2005/0189218 A1* 9/2005 Qian et al. ............. 204/298.41

* cited by examiner

METHOD AND APPARATUS FOR CATHODIC ARC ION PLASMA DEPOSITION

FIELD OF THE INVENTION

The present invention is directed to a method and apparatus for performing ion plasma deposition (IPD), and, more particularly, to a hollow tubular cathode that forms a plasma arc circumferentially around the outer surface of the cathode.

BACKGROUND OF THE INVENTION

The IPD method comprises placing a cathode formed of a coating material into a vacuum environment within a vacuum chamber, providing a workpiece having a surface within the vacuum environment, supplying a current to the cathode to form a cathodic arc upon a cathode surface resulting in erosion or evaporation of coating material from the cathode surface, and depositing the coating material from the cathode upon the workpiece surface. The surface of the workpiece may be referred to more generally as a substrate surface. The workpiece may be a turbine blade part or component in need of coating or repair, but the method and apparatus can be used to deposit coating materials upon any substrate surface that can be subject to an IPD method.

A cathodic arc is formed upon a surface of a cathode when a cathode and an anode are placed in a vacuum environment, and a sufficient voltage is applied to the cathode to create a sufficient potential between the cathode and the anode to form a discharge on a surface of the cathode. This discharge creates a highly ionized metal plasma from the erosion of the cathode. The arc is formed for a short period of time, extinguishes and reforms rapidly, giving the appearance that the arc is moving continuously over the surface of the cathode.

The erosion of the cathode forms a cloud of coating material containing ions, charged particles, vapors and neutral droplets in the vacuum environment. This coating material is then available for deposition within the vacuum environment. The coating material may deposit upon cool surfaces in the vacuum environment by condensation, and also upon an anode surface by electrical attraction as well as condensation.

A workpiece may be placed in the vacuum environment to form a coating upon a surface of the workpiece. The workpiece may be manipulated within the vacuum environment to produce a uniform coating over the entire surface of the workpiece, or the workpiece may be masked in order to produce a coating on a selected surface. The workpiece may be held at ground potential or a voltage bias may be applied to the workpiece to affect material deposition by increasing the attraction of ions and charged particles to the surface.

The anode may be a conductive surface of the vacuum chamber or a separate structure within the vacuum chamber. The function of the anode is to sink electrons from the cathode to sustain the electrical discharge.

In the past, cathodes have been formed of solid cylindrical stock having a flat end-face. These cathodes are typically cut to short lengths of about 4.4 cm with an outside diameter of about 6.3 cm. The plasma arc is formed at the flat end-face of the cathode open to the vacuum environment.

Multiple cathodes are often positioned in a vacuum chamber around the workpiece to increase the amount of coating material available for coating upon the workpiece surface. These conventional cathodes operate on current of approximately 40 A to approximately 1200 A.

A plasma deposition system has been disclosed by S. A. Mouboiadjian, E. N. Kablov and Ya. A. Pomeloov in their paper "Equipment, technology and protective coatings produced by ion bombardment deposition." This system discloses a cylindrical cathode that has an arc formed on a circumferential surface. However, the structure requires a ring-shaped cooled anode and electromagnetic coil fixed coaxially around the cathode to effect arcing.

Currently, the cost of an IPD process is dominated by factors pertaining to the cathode. A cathode that allows for more coating material to be available to the coating process will have a significant impact on the process cost by allowing the process to be operated for greater periods of time without having to replace the cathodes. Additionally, by not requiring the cathode to be replaced as often, a more uniform and improved coating material may be deposited.

Other features and advantages of the present invention will be apparent from the following more detailed description of a preferred embodiment, taken in conjunction with the accompanying drawings, which illustrate by way of example, the principles of the invention.

SUMMARY OF THE INVENTION

The present invention provides an apparatus and method for performing IPD of coating materials onto a substrate surface. A novel cathode design is also disclosed for use in the apparatus that improves operation of the deposition process. The method comprises placing a cathode of a coating material, an anode, and a substrate into a vacuum environment, applying a current to the cathode, forming a cathodic arc upon a surface of the cathode that results in erosion or evaporation of coating material from the cathode, and depositing the coating material from the cathode upon a surface of the substrate.

A cathode of the coating material is formed into a hollow cylinder having a center axis, an outer circumferential surface having an outer diameter from the center axis, an inner circumferential surface having an inner diameter from the center axis, and a hollow bore existing between the center axis and the inner diameter.

The hollow cathode allows for magnets to be placed and moved axially in the hollow bore of the cathode. The axial movement of the magnets moves the arc axially over the length of the cathode. This axial movement of the arc allows the cathode to be eroded evenly over approximately 90% of the full axial length, providing many advantages over prior IPD systems.

Since the hollow cathode is formed with a greater axial length than the prior art cathodes, and the arc can be controlled for a more even erosion of coating material from the cathode surface, more coating material is available for erosion and subsequent deposition upon the substrate surface. The increase in coating material results in fewer interruptions during coating to replace cathodes, that further leads to improved coating layer characteristics since a more homogeneous layer will be deposited.

Further aspects of the method and apparatus are disclosed herein. The features as discussed above as well as other features and advantages of the present invention will be appreciated and understood by those skilled in the art from the following detailed description and drawings.

DETAILED DESCRIPTION OF THE INVENTION

Disclosed herein is a method and apparatus using ion plasma deposition (IPD) to apply a coating material to a substrate surface. A hollow cathode is disclosed as a part of the apparatus. The hollow cathode is preferably substantially cylindrical. This cathode geometry improves operation of the deposition process. The hollow cathode has a center axis and an outer circumferential surface at an outside diameter, an inner circumferential surface at an inside diameter, and a hollow bore between the center axis and the inside diameter. The method comprises placing the hollow cathode, an anode, and the substrate into a vacuum environment, applying a current to the cathode, forming a cathodic arc on the cathode surface that removes coating material from the cathode by erosion and/or evaporation, and depositing coating material eroded from the cathode onto a substrate surface.

Figure 1:
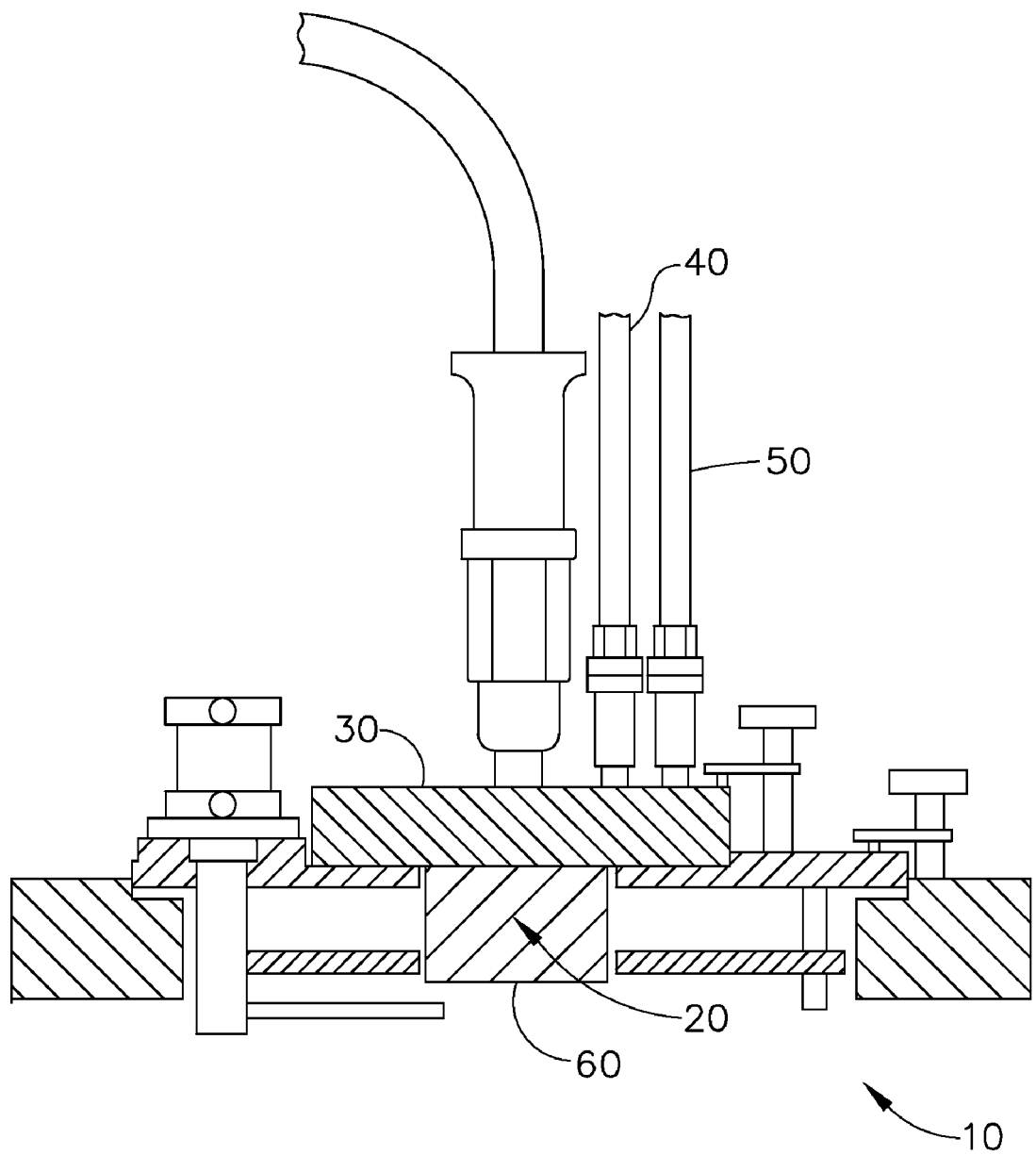
FIG. 1 depicts a cross-sectional view of a prior art IPD apparatus.

A conventional IPD device 10 is shown at FIG. 1 as prior art. The conventional IPD device uses a solid cathode 20 formed of a coating material to form a cathodic arc. The cathode is supported by an evaporator plate 30. The evaporator plate 30 is cooled via a cooling fluid inlet 40 and fluid return 50 that circulate a cooling fluid through internal passages (not shown) in the evaporator plate 30. The cathode and an anode (not shown) are contained within a vacuum chamber (not shown). The anode may be a surface of the vacuum chamber, or may be a separate anode within the vacuum chamber. The vacuum chamber is connected to a vacuum system for producing a vacuum within the chamber. The vacuum chamber also contains a workpiece with a surface to be coated with the coating material that is eroded or evaporated from the cathode.

The cathode is supplied with a current from a current source, which creates the cathodic arc at the end face 60 of the cathode resulting in erosion or evaporation of coating material from the cathode end face 60. This erosion or evaporation forms a cloud of droplets and ions of coating material within the vacuum chamber. The droplets and ions are deposited from the cloud upon a surface of a workpiece within the vacuum chamber by condensation. The workpiece may be provided with a voltage bias or ground to increase coating deposition by attracting charged particles within the cloud to the workpiece surface.

Figure 2:
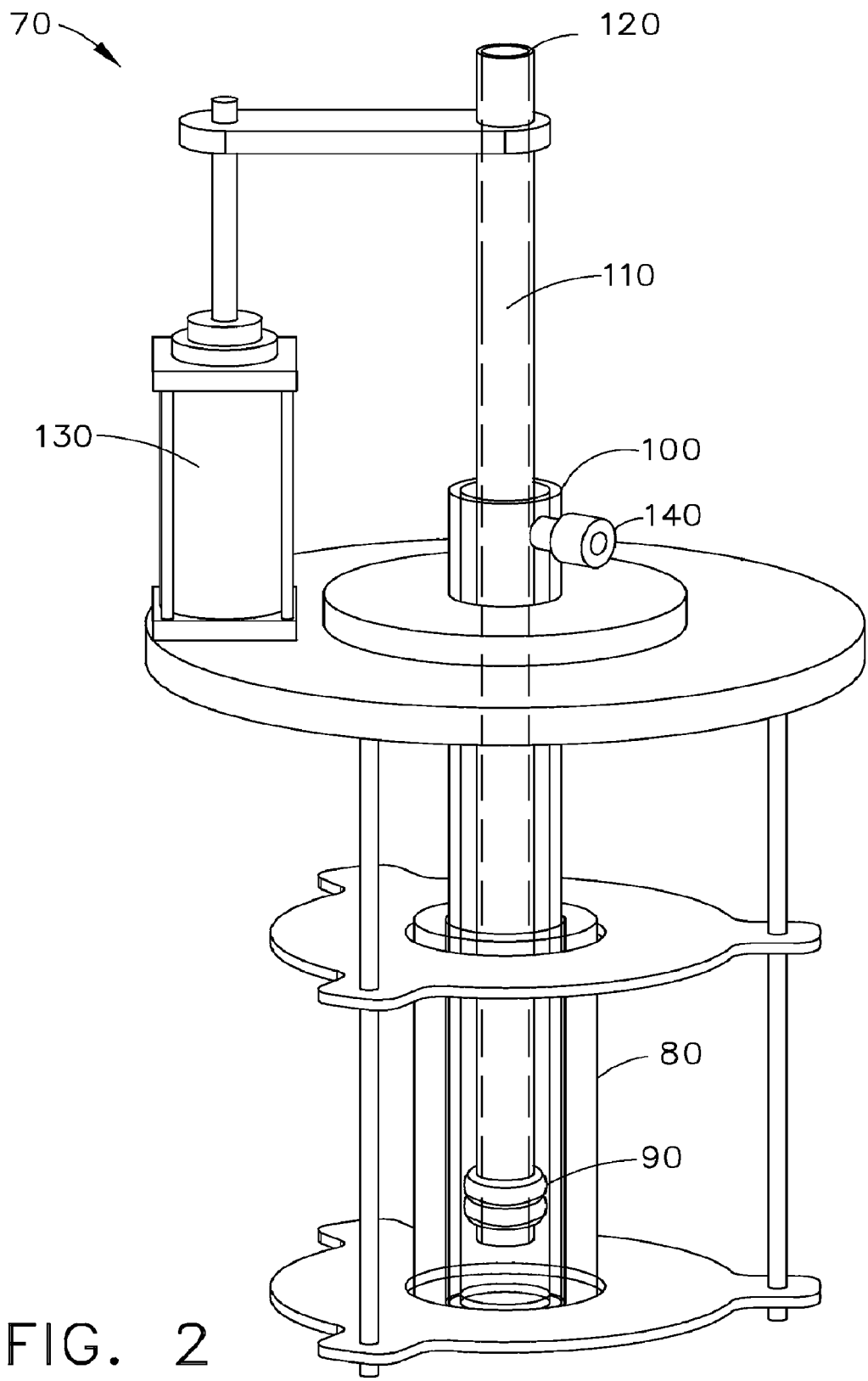
FIG. 2 is a schematic perspective view of an embodiment of an IPD cathode assembly equipped with a hollow cathode according to an embodiment of the present invention.

Referring now to FIG. 2, an embodiment of an IPD cathode assembly according to the present invention is shown at 70. A hollow cathode 80, preferably of a substantially cylindrical shape, is formed of a coating material and having a center axis with an outer circumferential surface at an outside diameter, an inner circumferential surface at an inner diameter, and a hollow bore between the center axis and the inner diameter, is placed within a vacuum chamber (not shown).

The vacuum chamber also contains an anode and workpiece having an exposed surface to be coated with coating material removed from the cathode. The anode may be a surface of the vacuum chamber or may be a separate anode within the vacuum chamber. The vacuum chamber is connected to a vacuum system for generating a vacuum within the chamber. The vacuum chamber is evacuated to a pressure of $10^{-4}$ torr or lower. The coating is typically performed at a pressure of $10^{-5}$ torr.

The cathode 80 is attached to a negative terminal of a DC power supply such as an arc welder (not shown). A current of approximately 85 A to approximately 300 A is provided to the cathode 80. The amount of current is substantially determined by the cathode material and a desired rate of erosion or evaporation of the coating material from the cathode surface. Greater currents may be applied to the cathode to increase erosion rate or when using higher melting point coating materials. A vacuum is formed in the vacuum chamber by any conventional vacuum system known in the art.

The apparatus is prepared for operation by placing internal arc drive magnet 90 in the cooling tube 100 that is extended into a hollow space or bore of the cathode 80. Internal arc drive magnet 90 may be formed of a single permanent magnet or a plurality of permanent magnets. The cooling tube 100 is made of a material that is capable of providing physical support to the apparatus structure and that is also invisible to magnetic fields. The cooling tube 100 is preferably made of austenitic stainless steel. The magnet 90 is attached to an end of a magnet drive tube 110 that has as a cooling fluid inlet 120. The magnet drive tube 110 should be made of a material that is capable of withstanding operating temperatures and is invisible to magnetic fields. The inlet tube is preferably made of stainless steel.

The magnet drive tube 110 is attached to a stepper mechanism 130 or other suitable drive system to axially move the magnet drive tube 110 with the attached magnet 90 over the axial length of the cathode 80. The stepper mechanism 130 may be interchanged with a linear actuator or similar system to provide axial motion of the magnet drive tube.

A cooling fluid, typically water, is introduced into the cooling fluid inlet 120 and flows towards the magnet 90. The cooling fluid passes through the magnet 90 and exits the magnet drive tube into the annular space between the outer diameter of the magnet drive tube 110 and the inner diameter of cooling tube 100. The cooling fluid proceeds to flow in an upward direction until it reaches a cooling fluid outlet 140 at which point it is removed from the apparatus.

Figure 3:
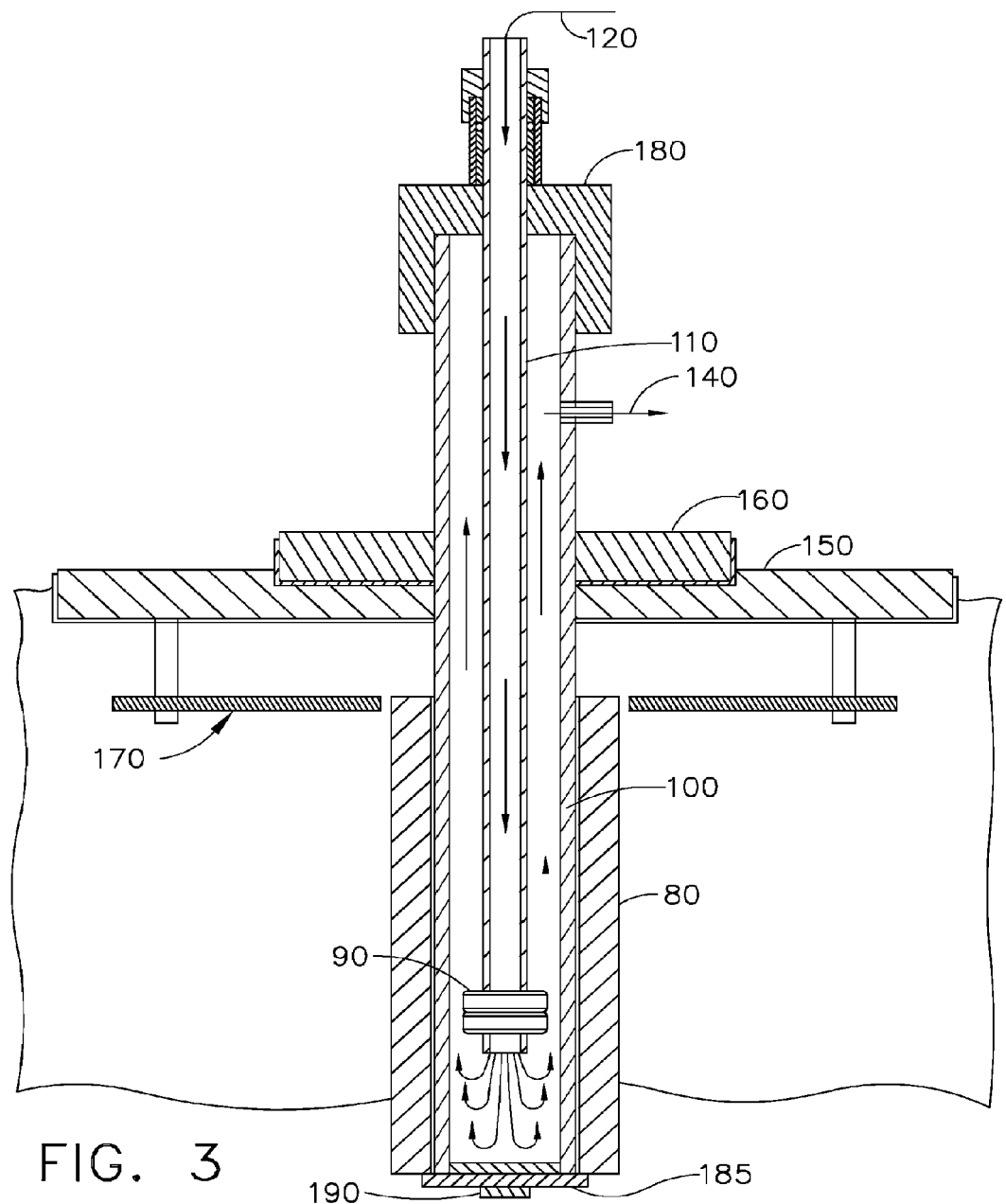
FIG. 3 is a detailed cross-sectional view of the IPD cathode assembly of FIG. 2.

FIG. 3 shows a more detailed view of at least a portion of the IPD cathode assembly. The cooling tube 100 is surrounded by a lower evaporator plate 150 and an upper evaporator plate 160 in the vacuum chamber. A ground shield 170 is used to sustain the arc down onto the cathode 80, and also to prevent evaporant from depositing on the evaporator plate 150 and the upper portion of the cooling tube 100. A seal 180 allows the magnetic drive tube 110 to move axially within the cooling tube 100 and at east partially forms one end to the annular space between the magnetic drive tube 110 and the cooling tube 100. A lower plate 185, preferably a stainless steel washer, is brought in contact with the bottom of both the cathode 80 and the cooling tube 100 by a nut 190 that is secured to the bottom of the cooling tube 100 and sealed by any suitable means, such as welding. When the cathode 80 is formed of a high temperature material such as a superalloy, the lower plate 185 and nut 190 may be formed of a material such as Inconel® to reduce contamination should the arc accidentally jump to these components.

Furthermore, as shown in FIG. 3, the cathode 80 axially surrounds a portion of cooling tube 100. The cathode 80 is slip-fit over the cooling tube 100, and is held in place by a plate 185 at an axial end of the cathode 80 and the cooling tube 100. The cathode 80 may be partially in contact with the cooling tube 100, but a slight gap, as shown may be present between the cathode 80 and the cooling tube 100.

FIG. 3 further shows the direction of cooling fluid flow with arrows within the magnetic drive tube 110 and the cooling tube 100. It should be apparent that the direction of cooling fluid flow may be reversed without affecting the ability to cool the magnet 90 to a temperature below its Curie temperature to maintain magnetic capability of the magnet 90 if formed of a permanent magnet material. Also, the cooling fluid need not be a liquid, and the apparatus may be modified to allow for gas cooling. Furthermore, the cooling fluid may be under pressure to improve cooling performance.

In a demonstration of the invention, the magnet 90 was initially located in the hollow bore at either end of the cathode 80. An arc was initially formed upon the cathode 80 by striking with a conventional arc striker (not shown). The arc formed on the outer circumference of the cathode 80 in the axial vicinity of the magnet 90. The arc formed as an approximate point discharge that moved circumferentially around the cathode 80 at such a rapid rate that the arc appeared to form uniformly around the circumference of the cathode 80.

The magnet 90 was then moved axially by the stepper mechanism 130 over the length of the cathode 80 at a rate of approximately 1-3 mm/sec. The arc followed the magnet 90 axially while continuing to move circumferentially around the cathode 80. In this manner, the arc moved axially over a length of the cathode 80. Uniform erosion was achieved with an axial movement rate of approximately 2 mm/sec. The magnet 90 was moved at a steady rate and not allowed to dwell in a particular axial location in order to keep the erosion of the cathode 80 as even as possible. The axial movement of the arc over the circumferential surface of the cathode 80 greatly improved cathode life. When the magnet 90 was located proximate the axial ends of the cathode 80, the arc substantially remained upon the outer circumferential surface of the cathode 80 and not upon the axial end face of the cathode 80.

The surface temperature of the cathode 80 at the vicinity of the arc must be sufficient to erode or evaporate coating material from the cathode 80 surface, creating a cloud of metal droplets and ions of the coating material within the vacuum chamber. The surface temperature is determined by the dwell time of the arc at any particular axial location as well as the amount of current supplied to the cathode 80. A workpiece or multiple workpieces may be continuously manipulated within the cloud and the metal droplets condense upon the cool part surface, forming a coating. The workpiece or workpieces may be at electrical ground or a bias potential to enhance coating performance. Also, masking may be applied to the workpiece to define surfaces to be coated.

The cathode 80 may heat in excess to temperatures of at least about 800° C. during the IPD process. The hot inner circumferential walls of the cathode 80 will radiate heat to any mechanism within the cathode 80. This heating requires that the permanent magnet 90 within the cathode be cooled to a temperature below their Curie temperature so as to not lose permanent magnetic properties.

The IPD apparatus requires no direct cooling of the cathode 80 under most conditions, thus creating a substantial savings to operating cost. However, it is within the scope of the invention to apply direct cooling to the cathode 80 to allow the cathode to operate at or near the melting point of the cathode material or to allow for the use of lower melting point cathode material that cannot operate in an incandescent mode.

A cooling paste or other thermally conductive material may be inserted between the cooling tube 100 and the inner surface of the cathode 80 to provide for direct cooling by increasing cooling to the cathode 80 through improved heat transfer from the cathode 80 to the cooling tube 100. The cooling paste may be an electrically and thermally conducting epoxy such as a silver filled epoxy Silvertech PT® 1 from Williams Advanced Materials. The epoxy is applied over substantially the entire outer circumferential surface of the cooling tube 100 that is axially covered by the cathode 80, and substantially eliminates any void space between the cathode 80 and the cooling tube 100 to provide for direct cooling of the cathode 80.

The cathode 80 is manufactured in the form of a tube or pipe of the material to be deposited and may be formed by any conventional method including machining, electrical discharge machining, or casting. Good performance was observed with a cathode 80 formed with an outside diameter of about 6.6 cm and an inner bore of about 4.4 cm. The cathode 80 may be of any length, with cathodes of about 12.7 cm or more demonstrated to provide good performance. However, it will be appreciated that cathodes of varying sizes are within the scope of the invention and could be used based on the coating application.

The cathode 80 is formed of coating materials such as metal alloys, intermetallics, or elemental metals. These coating materials include, but are not limited to nickel aluminum alloys, NiCrAlX alloys, titanium and titanium alloys, and refractory metals and their alloys. NiCrAlX alloys are alloys wherein X is selected from a group of yttrium, hafnium, zirconium, lanthanum or combinations thereof.

Additionally, the cathode 80 may be formed of multiple coating materials. For example, the cathode 80 may be formed of different material rings 200 that are substantially axially aligned. For example, a cathode 80 may be formed of separate rings of nickel, aluminum, chrome, and zirconium, so that a coating of NiAlCrZr may be formed. Alternatively, a first ring of NiAl and a second ring of CrZr may be used to form a NiAlCrZr coating. The rings may be stacked and not joined to one another upon the cooling tube 100 or the rings may be fixed to one anther by any suitable method, such as tac welding. The cathode 80 may be initially formed of the different material rings 200, such as through a multi-material extrusion process.

Figure 4:
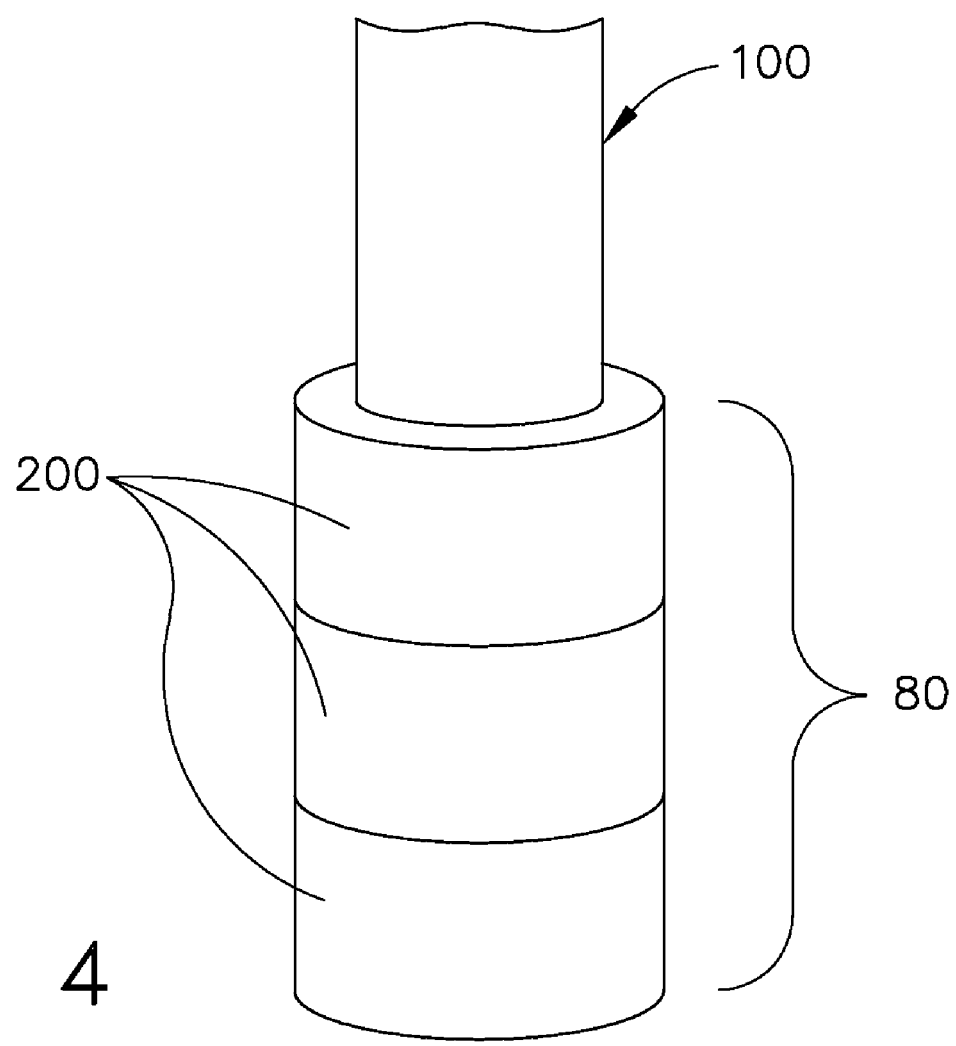
FIG. 4 is a detailed perspective view of a cathode comprising rings of different coating materials according to another embodiment of the invention.

An arrangement of the cooling tube 100 and cathode 80 of different material rings 200 of coating material is shown in FIG. 4. In this manner, different coating materials may be eroded as the arc moves axially along the cathode 80, allowing for different coating materials to be deposited. The dwell time of the arc in any particular coating material ring can be adjusted to allow for uniform erosion of the cathode 80, or the erosion may be non-uniform if different coating material amounts to be deposited are desired.

The cathode 80 and accompanying IPD apparatus incorporating the cathode 80 operated by the disclosed method show improved cathode life and a resulting reduction in maintenance required from frequent changing the cathode 80 during operation. Additionally, the invention allows for the use of higher arc currents resulting in faster processing time as when compared to conventional cathodes in the art. Additionally, the invention allows for the deposition of different coating materials from a single cathode. The invention substantially improves cathode performance and results in the use of fewer cathodes in the vacuum chamber since more of the material of the cathode may be used for coating a substrate surface.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method of depositing a coating on a surface of a component, said method comprising:

providing a cooling tube secured to a chamber so that a closed end of the cooling tube is disposed within the chamber and an oppositely-disposed end of the cooling tube is outside the chamber, a drive tube axially movable within the cooling tube, means for axially moving the drive tube within the cooling tube, and at least one magnet coaxially mounted on the drive tube adjacent a distal end thereof for axial movement with the drive tube within the cooling tube;

providing a hollow cathode comprising at least a first coating material having an axial length and defining an outer circumferential surface of the cathode, the cathode having a center axis, an inner circumferential surface defining a hollow bore within the cathode, an open end defined by the bore at a first axial end of the cathode, and an oppositely-disposed second axial end;

mounting the cathode on the closed end of the cooling tube by slip-fitting the open end of the cathode over the closed end of the cooling tube so that the cathode and the first coating material thereof surround the distal end of the drive tube and the magnet mounted thereon;

connecting a power source to the cathode;

subjecting the cathode, an anode, and the component to a vacuum environment within the chamber;

applying a current to the cathode to form an arc at the outer circumferential surface of the cathode to remove portions of the first coating material from the outer circumferential surface and form a cloud of the first coating material within the vacuum environment, the arc moving circumferentially around the cathode in the axial vicinity of the magnet;

operating the axial moving means to axially move the drive tube and the magnet mounted thereto within the bore of the cathode to cause the arc to move axially over the axial length of the first coating material as the arc continues to move circumferentially around the cathode in the axial vicinity of the magnet; and depositing the first coating material from the cloud onto a surface of the component.

2. The method of claim 1, wherein the first coating material is a nickel aluminum alloy.

3. The method of claim 1, further comprising flowing a coolant through the drive tube on which the magnet is mounted, discharging the coolant through the distal end of the drive tube, and flowing the coolant around the magnet and through an annular passage defined between the drive tube and the cooling tube.

4. The method of claim 1, wherein the arc component is a turbine blade component.

5. The method of claim 1, further comprising sustaining the arc on the cathode with a ground shield disposed between the cathode and a wall of the chamber to which the cooling tube is secured.

6. The method of claim 1, wherein the cathode comprises at least a second coating material and the axial moving means is operated to dwell at axial locations of the cathode corresponding to the first and second coating materials to deposit different amounts of the first and second coating materials.

7. The method of claim 1, wherein the cathode is mounted on the closed end of the cooling tube so that the second axial end of the cathode is adjacent the closed end of the cooling tube.

8. The method of claim 7, wherein the cathode is mounted on the closed end of the cooling tube by securing the second axial end of the cathode to the closed end of the cooling tube.

* * * * *

UNITED STATES PATENT AND TRADEMARK OFFICE
CERTIFICATE OF CORRECTION

PATENT NO. : 7,879,203 B2  Page 1 of 1
APPLICATION NO. : 11/609078
DATED : February 1, 2011
INVENTOR(S) : Weaver et al.

It is certified that error appears in the above-identified patent and that said Letters Patent is hereby corrected as shown below:

In Column 2, Lines 14-18, delete "Other features....... of the invention".

In Column 4, Line 47, delete "at east" and insert -- at least --, therefor.

Signed and Sealed this
Fourteenth Day of June, 2011

David J. Kappos
*Director of the United States Patent and Trademark Office*